United States Patent
Unno et al.

(10) Patent No.: US 7,095,161 B2
(45) Date of Patent: Aug. 22, 2006

(54) PIEZOELECTRIC RESONATOR

(75) Inventors: Yukihiro Unno, Okaya (JP); Katsuhiko Miyazaki, Minowa-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/799,746

(22) Filed: Mar. 15, 2004

(65) Prior Publication Data

US 2004/0217673 A1    Nov. 4, 2004

(30) Foreign Application Priority Data

Mar. 20, 2003  (JP)  ............................. 2003-078776
Dec. 10, 2003  (JP)  ............................. 2003-411852
Feb. 18, 2004  (JP)  ............................. 2004-041469

(51) Int. Cl.
    *H03H 9/17*    (2006.01)
(52) U.S. Cl. ...................... 310/348; 310/320; 310/364; 310/365; 310/366
(58) Field of Classification Search ........ 310/364–366, 310/320, 348
    See application file for complete search history.

(56) References Cited

U.S. PATENT DOCUMENTS

2002/0030419 A1*  3/2002  Suzuki et al. ............... 310/320
2003/0058066 A1*  3/2003  Taniguchi et al. .......... 333/193
2004/0135474 A1*  7/2004  Koyama et al. ............. 310/348
2004/0263026 A1* 12/2004  Wang ........................ 310/341

FOREIGN PATENT DOCUMENTS

| JP | A 7-74581    | 3/1995  |
| JP | A-10-173475  | 6/1998  |
| JP | A 11-214950  | 8/1999  |
| JP | A-2000-151283| 5/2000  |
| JP | A-2001-358559| 12/2001 |
| JP | A 2003-133887| 5/2003  |
| JP | A 2004-7092  | 1/2004  |

* cited by examiner

*Primary Examiner*—Darren Schuberg
*Assistant Examiner*—J. Aguirrechea
(74) *Attorney, Agent, or Firm*—Oliff & Berridge, PLC

(57) ABSTRACT

To make a substantial mounting area smaller. A piezoelectric resonator has a piezoelectric resonator element accommodated in a package. The piezoelectric resonator element includes a pair of connection electrodes which are connected to excitation electrodes. The respective connection electrodes are joined to mount electrodes formed in the package. The piezoelectric resonator includes four external electrodes at the outer surface of the bottom of the package. The external electrodes disposed along the shorter latus of the package on one side in the lengthwise direction thereof are electrically connected with the mount electrodes to which the respective connection electrodes of the piezoelectric resonator element are connected.

9 Claims, 11 Drawing Sheets

K1

K2 though it is. Moreover, the parasitic capacitance of the piezoelectric resonator 10 is increased by the circumvention of the wiring pattern 34 near the piezoelectric resonator 10.

PIEZOELECTRIC RESONATOR

BACKGROUND OF THE INVENTION

1. Field of Invention

The present invention relates to a piezoelectric resonator. More particularly, it relates to a piezoelectric resonator in which four external electrodes are disposed on the outer bottom surface of a package, and a piezoelectric oscillator which utilizes the piezoelectric resonator.

2. Description of Related Art

Piezoelectric resonators are extensively employed in various electronic equipment including a communication apparatus, an electronic computer, etc. Typically, the piezoelectric resonator has a structure in which a piezoelectric resonator element made of a piezoelectric material, such as quartz, is accommodated in a package. The piezoelectric resonator has been made smaller and thinner in correspondence with the smaller and thinner construction of electronic equipment. The surface mount type of piezoelectric resonator has come into wide use in recent years. The piezoelectric resonator of the surface mount type includes external electrodes which are joined to patterns disposed on the base plate of the electronic equipment, on the outer bottom surface of the insulating package which is made of ceramics or the like.

Heretofore, a piezoelectric resonator of surface mount type (hereinbelow, "piezoelectric resonator") has been such that a pair of connection electrodes to be disposed for a piezoelectric resonator element are formed on one side of the piezoelectric resonator element in the lengthwise direction thereof and that the piezoelectric resonator element is mounted in a package in the shape of a cantilever. The piezoelectric resonator has been such that external electrodes are formed at both the end parts of the package in the lengthwise direction thereof so as to prevent any electrical directivity ascribable to mounting, when it is mounted on a substrate. Also, the connection electrodes of the piezoelectric resonator element are electrically connected to the external electrodes. See JP-A-7-74581.

There has also been a related-art piezoelectric resonator wherein external electrodes are formed at the four corners of the outer surface of the bottom of a package, respectively, and the connection electrodes of a piezoelectric resonator element are electrically connected to one pair of external electrodes lying on the diagonal line of the outer bottom surface, respectively. See JP-A-11-214950. The four external electrodes are joined to patterns disposed on the substrate, thereby to enhance the mounting intensity of the piezoelectric resonator element on the substrate. In a case where the cover member of the package is made of a metal, the other pair of external electrodes to which the piezoelectric resonator element is not connected are connected to the ground of the substrate and are electrically connected to the cover member, thereby to electromagnetically shield the interior of the package.

FIG. 10 is a drawing showing a related-art piezoelectric resonator provided with four external electrodes, wherein A is a schematic of the piezoelectric resonator with a cover member omitted therefrom, B is a sectional schematic taken along plane B—B in A, in a state where the piezoelectric resonator includes the cover member and C is a bottom view.

As shown in FIG. 10A, the piezoelectric resonator 10 has a piezoelectric resonator element 14 accommodated in a package 12. The piezoelectric resonator element 14 is made of a piezoelectric material, for example, an AT-cut quartz plate and is provided with excitation electrodes 16*a*, 16*b* (the excitation electrode 16*b* is not shown) at the middle parts of upper and lower surfaces. The piezoelectric resonator element 14 has a pair of connection electrodes 18 (18*a*, 18*b*) on one side in the lengthwise direction thereof. The respective connection electrodes 18 are formed in continuation to the upper and lower surfaces of the piezoelectric resonator element 14 and are electrically connected to the corresponding excitation electrodes 16 (16*a*, 16*b*), and the electrodes of the upper and lower surfaces are formed in symmetry.

Inside the package 12, a pair of mount electrodes 20 (20*a*, 20*b*) are disposed in correspondence with the connection electrodes 18. As shown in FIG. 10B, the corresponding connection electrodes 18 are secured to the mount electrodes 20 by a conductive adhesive 22. The piezoelectric resonator 10 has external electrodes 24 (24*a*–24*d*) at the four corner parts of the outer surface of the bottom of the package 12, respectively. One mount electrode 20*a* in the package 12 is electrically connected to the external electrode 24*a* through a through-hole not shown. The other mount electrode 20*b* is electrically connected to the external electrode 24*c* through a connection wiring portion 26 shown in FIG. 10A (refer to FIG. 10C). That is, the pair of electrodes of the piezoelectric resonator element 14 are electrically connected to one pair of external electrodes 24*a*, 24*c* lying on the diagonal line of the package 12. The other pair of external electrodes 24*b*, 24*d* are connected to the ground of a substrate and are electrically connected to a cover member 28 so as to electromagnetically shield the interior of the package 12. The piezoelectric resonator 10 has the upper end of the package 12 sealed by the cover member 28 as shown in FIG. 10B.

SUMMARY OF THE INVENTION

In the piezoelectric resonator 10 stated above, the respective external electrodes 24 are joined to patterns (two of which are not shown) 32 disposed on the substrate, as shown in model-like fashion in FIG. 11. In the piezoelectric resonator 10, the pair of connection electrodes 18 of the piezoelectric resonator element 14 mounted in the package 12 are electrically connected through the external electrodes 24 and the patterns 32 to an IC 30 which constructs an oscillation circuit disposed on the substrate.

As stated above, the related-art piezoelectric resonator 10 having the four external electrodes 24 is such that the respective connection electrodes 18 of the piezoelectric resonator element 14 are connected to the pair of external electrodes 24*a*, 24*c* lying on the diagonal line. In case of connecting the piezoelectric resonator 10 to the IC 30, therefore, the external electrode 24*a* to which one connection electrode 18*a* is connected can be disposed near the IC 30. However, the external electrode 24*c* to which the other connection electrode 18*b* is connected cannot avoid being arranged at a position far from the IC 30. Accordingly, a wiring pattern 34 to electrically connect the IC 30 and the other external electrode 24*c* needs to be formed along the piezoelectric resonator 10. For this reason, even when the size of the piezoelectric resonator 10 has been reduced, the substantial mounting area thereof is difficult to reduce on account of the existence of the wiring pattern 34. This forms an obstacle to reduction in the size of electronic equipment. Moreover, the parasitic capacitance of the piezoelectric resonator 10 is increased by the circumvention of the wiring pattern 34 near the piezoelectric resonator 10.

In recent years, as mounting technology has been enhanced more and the performance of electronic equipment has been heightened, piezoelectric resonators have come to be mounted on substrates with their direction aligned uniformly. The piezoelectric resonators have come to be shipped with their direction held uniformly. In recent years, therefore, consideration for the electrical directivity of the piezoelectric resonator in the mounted state thereof has been relieved. The present invention has been made in view of the above circumstances, and makes a substantial mounting area smaller.

According to a first aspect of the invention, the above is accomplished by a piezoelectric resonator, at least four external electrodes which are joined to patterns on a substrate side being disposed at an outer surface of a bottom of a package in which a piezoelectric resonator element is accommodated; and one pair of adjacent external electrodes among the external electrodes being electrically connected to electrodes of the piezoelectric resonator element. According to the construction of the first aspect of the invention, the external electrodes to which one pair of connection electrodes of the piezoelectric resonator element are connected are set as the adjacent ones of the four external electrodes, the pair of external electrodes can be arranged near an IC disposed on a substrate. Accordingly, a wiring pattern need not be formed along the piezoelectric resonator element for the purpose of electrically connecting the IC of the substrate and the external electrode of the piezoelectric resonator, the substantial mounting area of the piezoelectric resonator can be made smaller, and reduction in the size of electronic equipment can be coped with. Moreover, since the wiring pattern need not be provided along the piezoelectric resonator, the parasitic capacitance of the piezoelectric resonator can be lowered, and oscillation characteristics can be enhanced.

In the construction of the first aspect of the invention, in a second aspect of the invention t the pair of external electrodes electrically connected to said piezoelectric resonator element are disposed along a shorter latus of the package. According to the construction of the second aspect of the invention, in a case where the piezoelectric resonator has been reduced in size, the region (area) of the resonant part of the piezoelectric resonator element constituting the piezoelectric resonator can be set large, and a piezoelectric resonator of high performance can be obtained.

In the construction of either of the first and second aspects of the invention, in a third aspect of the invention t the pair of adjacent external electrodes are electrically connected to the electrodes of said piezoelectric resonator element. One of the other pair of external electrodes is made a ground terminal, while the other is made a dummy terminal which is not electrically connected. According to the construction of the third aspect of the invention, even in a case where such a piezoelectric resonator has been erroneously connected onto a mounting substrate in which electrode pads or patterns lying at diagonal positions are power feeding terminals, one of the power feeding terminals is connected with the dummy terminal on the piezoelectric resonator side, as will be described in detail in exemplary embodiments, and hence, a malfunction does not occur.

In the construction of any of the first through third aspects of the inventions, in a fourth aspect of the invention at least one of the other pair of external electrodes is formed into a different shape. According to the construction of the fourth aspect of the invention, the pair of external electrodes and the other external electrode/electrodes can be distinguished by their external shapes, so that a clear clue can be afforded as to the directivity of the piezoelectric resonator in a mounting operation.

In the construction of the fourth aspect of the invention, in a fifth aspect of the invention at least one of the other pair of external electrodes is formed at only a position extending along an outer edge of the package. According to the construction of the fifth aspect of the invention, at least one, of the other pair of external electrodes is/are formed at only the position/positions extending along the outer edge of the package. Then, in such a case where an oscillation circuit element or the like is to be mounted on the bottom surface of the package, there is the advantage that unnecessary short-circuiting, etc. does not occur, so a space for the mounting can be larger.

In the construction of the fifth aspect of the invention, in a sixth aspect of the invention an external electrode which is a dummy terminal not to be electrically connected, is disposed in the vicinity of at least one of the other pair of external electrodes. According to the construction of the sixth aspect of the invention, undesirable electrical short-circuiting does not occur and the mounting intensity at the time of mounting the piezoelectric resonator is ensured.

In a seventh aspect of the invention, the above is accomplished by a piezoelectric oscillator including a piezoelectric resonator in which at least four external electrodes joined to patterns on a substrate side are disposed at an outer surface of a bottom of a first package that accommodates a piezoelectric resonator element therein, and in which one pair of adjacent external electrodes among the external electrodes are electrically connected to electrodes of the piezoelectric resonator element; a second package which is stacked under the first package and is joined thereto; and an oscillation circuit element which is accommodated in the second package, and which is electrically connected with the piezoelectric resonator element; at least one of the external electrodes is formed at only a position extending along an outer edge of the first package.

According to the construction of the seventh aspect of the invention, in a case where the oscillation circuit element accommodated in the second package is electrically connected by wire bonding in a mounting operation, there is a possibility that bonding wire for the wire bonding comes in contact with the external electrode of the first package stacked on the second package. When the external electrode is formed at only the position extending along the outer edge of the first package, as in the seventh aspect of the invention, the risk of the touch between the bonding wire and the external electrode is avoided.

DETAILED DESCRIPTION OF EXEMPLARY EMBODIMENTS

Figure 1A:
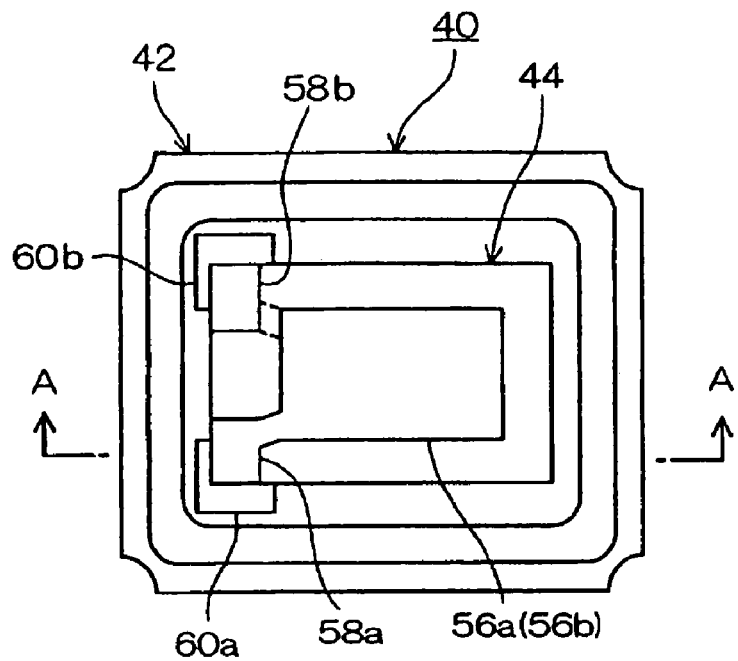
FIG. 1 is a schematic of a piezoelectric resonator according to an exemplary embodiment.
Figure 1B:
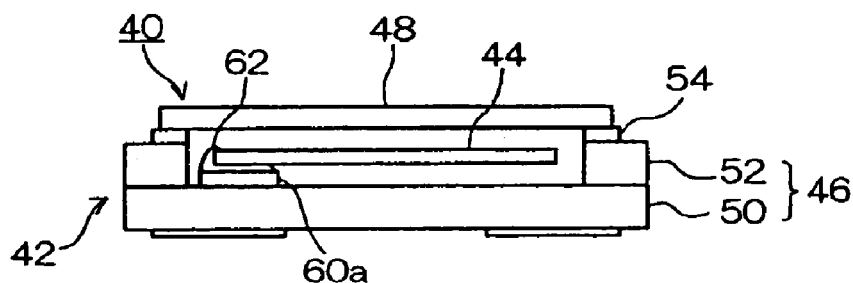

Exemplary embodiments of a piezoelectric resonator according of the present invention will be described in detail with reference to the accompanying drawings. FIG. 1 shows schematics of the piezoelectric resonator according to an aspect of the present invention, wherein A is a plan view of the piezoelectric resonator with a cover member omitted therefrom. B is a sectional schematic taken along plane A—A in 1, in a state where the piezoelectric resonator includes the cover member. C is a bottom view. Referring to FIG. 1, the piezoelectric resonator 40 has a structure in which a piezoelectric resonator element 44 is accommodated in a package 42. As shown in FIG. 1B, the package 42 includes a package body 46 and a cover member 48. The package body 46 has a double-layer structure which is constructed of a flat base sheet 50 that forms a bottom portion and a frame-like sheet 52 that is stacked on the base sheet 50. The base sheet 50 and the frame-like sheet 52 are made of an insulator and they are formed of ceramics in the exemplary embodiment. The interior of the package 42 is sealed gas tightly in such a way that the cover member 48 is joined to the upper surface of the package body 46 through a metal sealing ring 54 or the like. The cover member 48 is formed of an insulator plate of ceramics, glass or the like, or a metal plate.

The piezoelectric resonator element 44 accommodated in the package 42 is formed of a piezoelectric material, such as an AT-cut plate of quartz. As shown in FIG. 1A, the piezoelectric resonator element 44 is formed with excitation electrodes 56a, 56b (the excitation electrode 56b on a lower surface side is not shown) at the middle parts of both the upper and lower surfaces thereof. The piezoelectric resonator element 44 has a pair of connection electrodes 58 (58a, 58b) on one side in the lengthwise direction thereof. The respective connection electrodes 58 are formed in continuation to the upper and lower surfaces of the piezoelectric resonator element 44. In addition, the electrodes of the upper and lower surfaces of the piezoelectric resonator element 44 are formed in symmetry. The excitation electrode 56a on the upper surface side is connected to one connection electrode 58a, while the excitation electrode 56b on the lower surface side is connected to the other connection electrode 58b.

In the package 42, a pair of mount electrodes 60 (60a, 60b) are disposed on the upper surface of the base sheet 50 forming the inner surface of the package 42. The mount electrodes 60 correspond to the connection electrodes 58 of the piezoelectric resonator element 44, and they are disposed on one side of the package 42 in the lengthwise direction thereof. As shown in FIG. 1B, the piezoelectric resonator element 44 is mounted in the package 42 in such a way that the respective connection electrodes 58 are joined to the corresponding mount electrodes 60 by a conductive adhesive 62.

On the lower surface of the base sheet 50 forming the outer surface of the bottom of the package 42, external electrodes 64 (64a–64d), which are joined to patterns formed on a substrate, are respectively disposed at the four corners of the package 42. In case of the exemplary embodiment, one pair of adjacent external electrodes 64, among four external electrodes 64, are electrically connected to the pair of connection electrodes 58 with which the piezoelectric resonator element 44 is provided. In a case where the cover member 48 of the package 42 is made of a metal, at least one of the other pair of external electrodes 64 to which the piezoelectric resonator element 44 is not connected, is connected to the ground of the substrate and is electrically connected to the cover member 48, thereby to electromagnetically shield the interior of the package 42. Specifically, in the exemplary embodiment, the pair of external electrodes 64a, 64b, which are disposed along the shorter latus of the package 42 on one side in the lengthwise direction thereof, are electrically connected to the connection electrodes 58. The external electrodes 64a, 64b are formed at positions corresponding to the mount electrodes 60a, 60b, and are electrically connected to the corresponding mount electrodes 60 through through-holes or the like (not shown).

Figure 2:
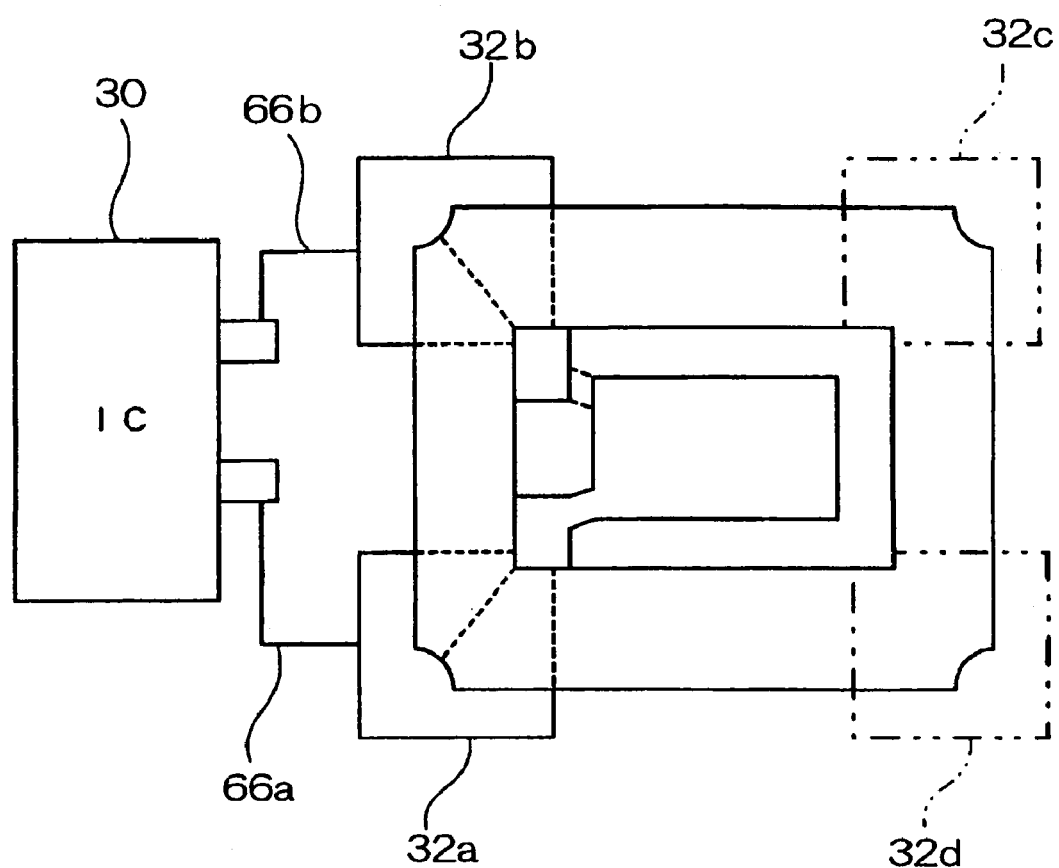
FIG. 2 is a schematic for explaining the mounted state of the piezoelectric resonator according to the exemplary embodiment.

In the piezoelectric resonator 40 of the exemplary embodiment thus constructed, the respective external electrodes 64 are joined to the patterns 32 (32a–32d) disposed on the substrate (not shown), as shown in FIG. 2. In the piezoelectric resonator 40 of the exemplary embodiment, the pair of connection electrodes 58 with which the piezoelectric resonator element 44 is provided are electrically connected through the mount electrodes 60 to the pair of adjacent external electrodes 64a, 64b which are disposed along the shorter latus of the package 42. Accordingly, in a case where the piezoelectric resonator element 44 of the piezoelectric resonator 40 is to be connected to an IC 30 for an oscillation circuit as is disposed on the substrate, the external electrodes 64a, 64b electrically connected to the connection electrodes 58 may be joined to the patterns 32a, 32b disposed near the IC 30. Therefore, the piezoelectric resonator 40 of the exemplary embodiment need not be provided with any wiring pattern extending along this piezoelectric resonator 40 itself, and wiring patterns 66 (66a, 66b) to connect the piezoelectric resonator 40 and the IC 30 can be shortened. Thus, the substantial mounting area of the piezoelectric resonator 40 can be made smaller. Moreover, since the piezoelectric resonator 40 does not require the wiring pattern extending along this piezoelectric resonator 40 itself, a parasitic capacitance in the case where the piezoelectric resonator 40 has been mounted on the substrate can reduced, and vibration characteristics can be enhanced.

Since the piezoelectric resonator 40 of the exemplary embodiment includes the four external electrodes 64 on the outer bottom surface of the package 42, the mounting intensity thereof can be enhanced by joining these external electrodes 64 to the patterns 32 disposed on the substrate. In the case where the cover member 48 of the piezoelectric resonator 40 is formed of a metal, at least either of the external electrodes 64c, 64d should desirably be electrically connected to this cover member 48 and also to the ground of the substrate. Thus, the cover member 48 functions as an electromagnetic shield, and the fluctuation of the oscillation frequency of the piezoelectric resonator 40 attributed to external noise can be suppressed.

Figure 1C:
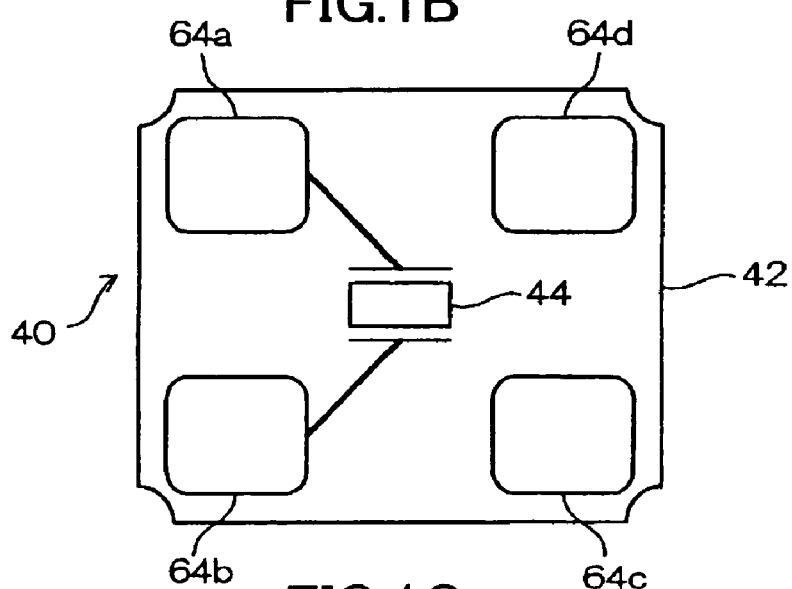
Figure 3:
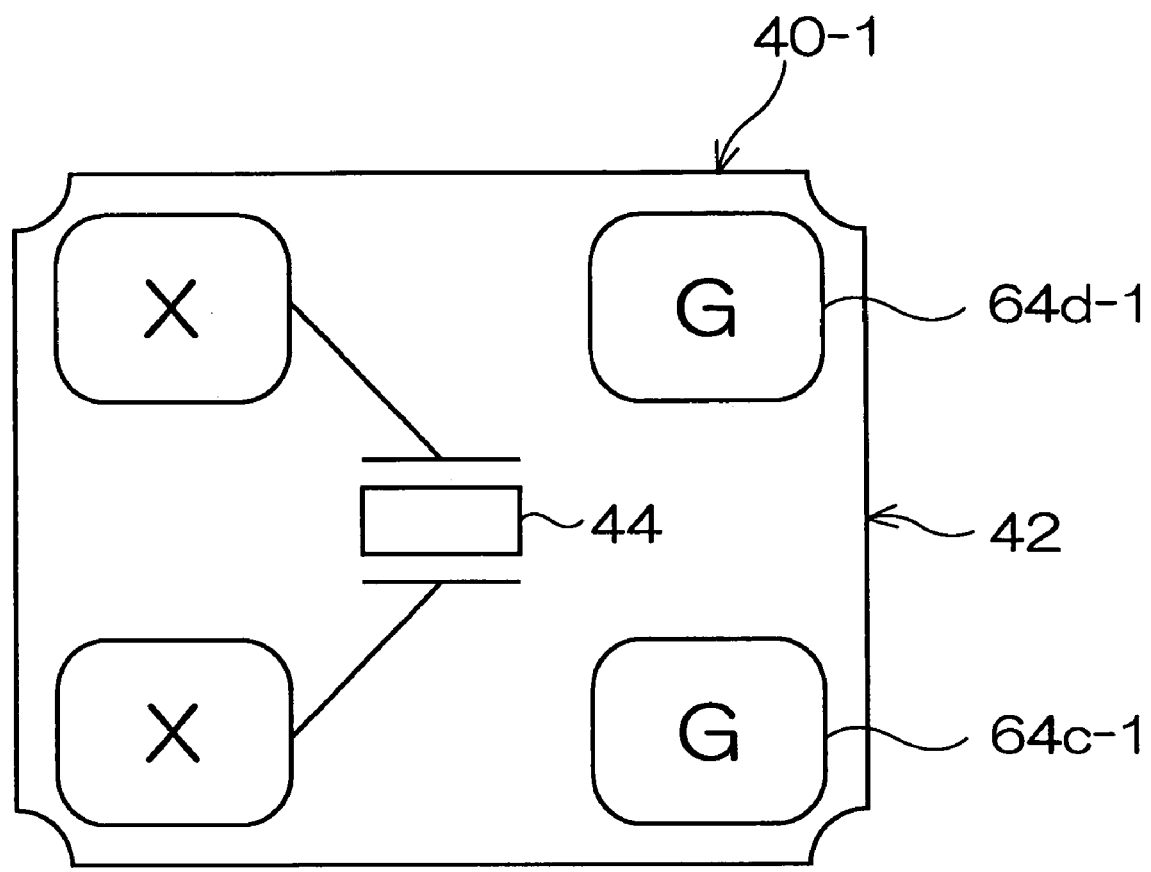
FIG. 3 is a schematic bottom view of Modification 1 of the piezoelectric resonator according to the exemplary embodiment.
Figure 4:
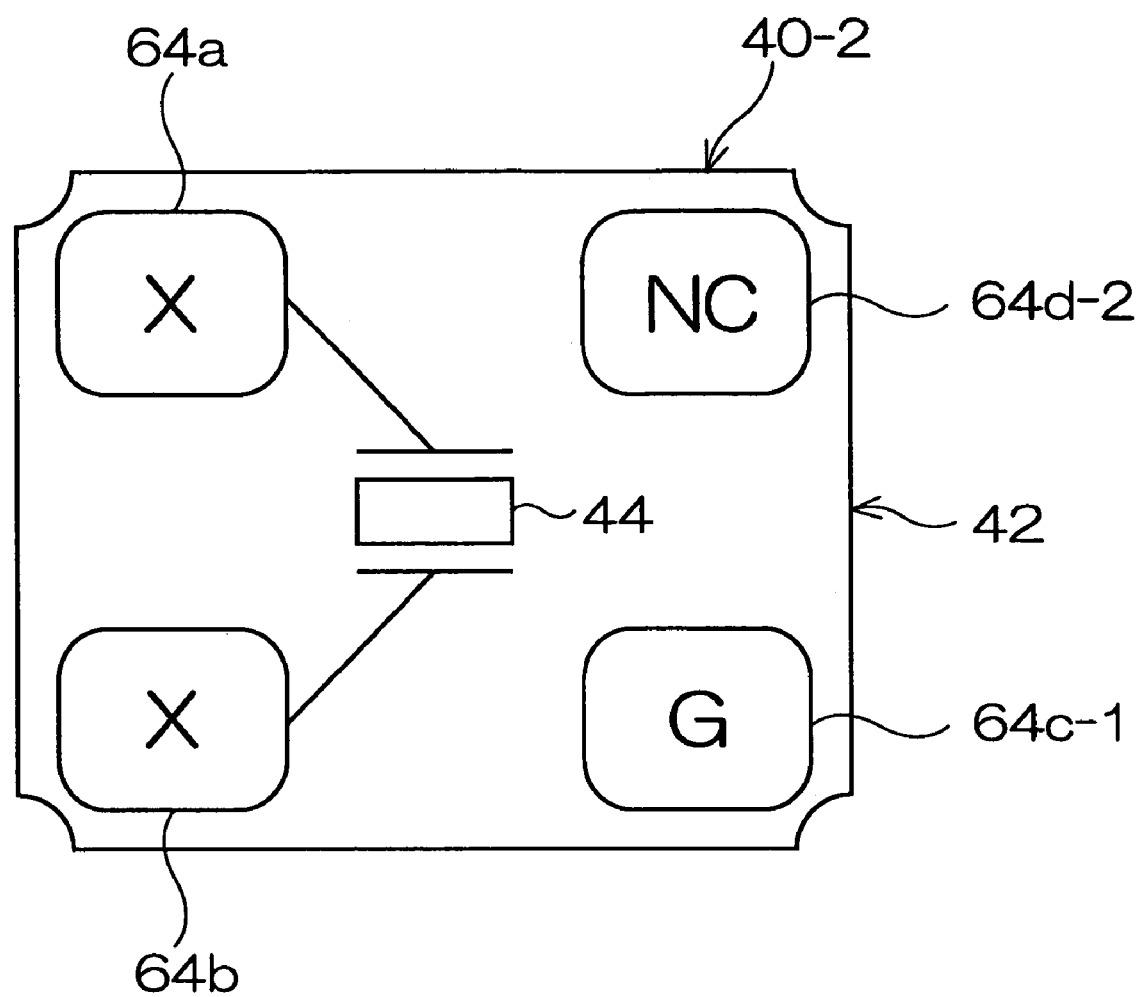
FIG. 4 is a schematic bottom view of Modification 2 of the piezoelectric resonator according to the exemplary embodiment.

FIGS. 3 and 4 show modifications concerning the above exemplary embodiment, respectively, and they show portions corresponding to FIG. 1C as to Modification 1 and Modification 2, respectively. In Modification 1 shown in FIG. 3, both external electrodes 64d-1 and 64c-1 are made ground terminals (G). The cover member 48 of the piezoelectric resonator 40 is made of a metal. The external electrodes 64d-1 and 64c-1 are electrically connected to the cover member 48 and are also connected to the ground of a mounting substrate. In Modification 2 shown in FIG. 4, an external electrode 64c-1 is made a ground terminal (G). The cover member 48 of the piezoelectric resonator 40 is made of a metal. The external electrode 64c-1 is electrically connected to the cover member 48. But an external electrode 64d-2 is a dummy terminal (NC) which is constructed so as not to be electrically connected to the cover member 48.

Figure 5:
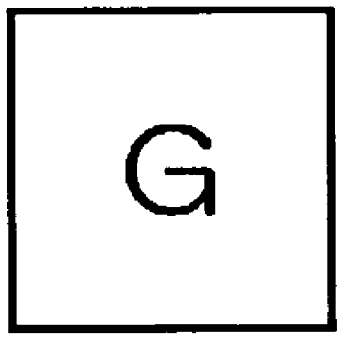
FIG. 5 is a schematic of the surface portions of mount electrodes in the related art.
Figure 5:
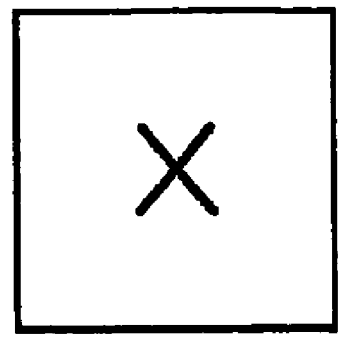
Figure 5:
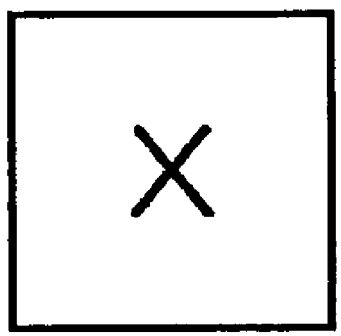
Figure 5:
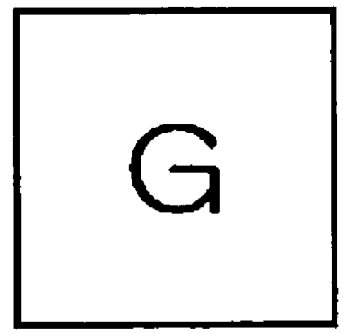
Figure 6:
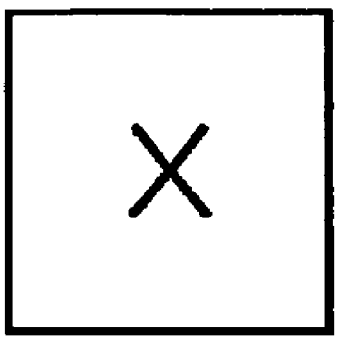
FIG. 6 is a schematic of the surface portions of mount electrodes.
Figure 6:
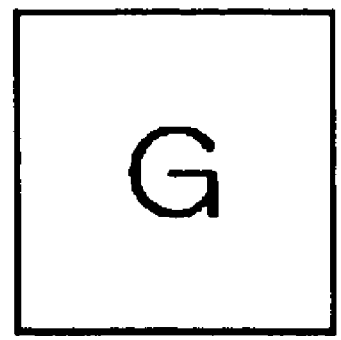
Figure 6:
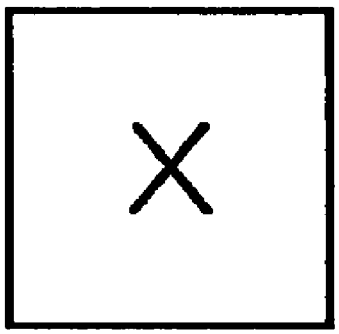
Figure 6:
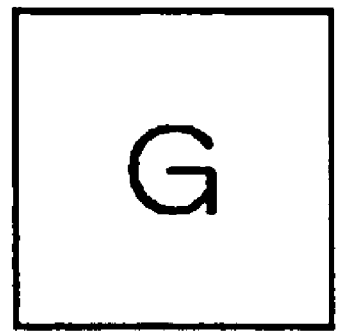
Figure 10A:
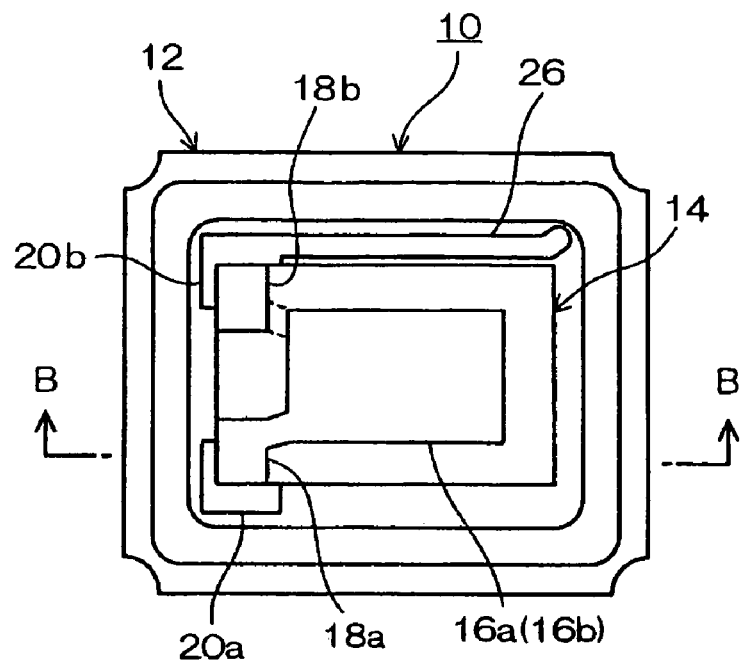
FIG. 10 is a schematic of a related-art piezoelectric resonator.
Figure 10B:
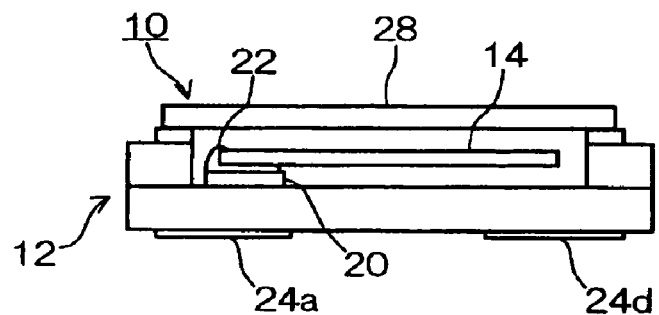
Figure 10C:
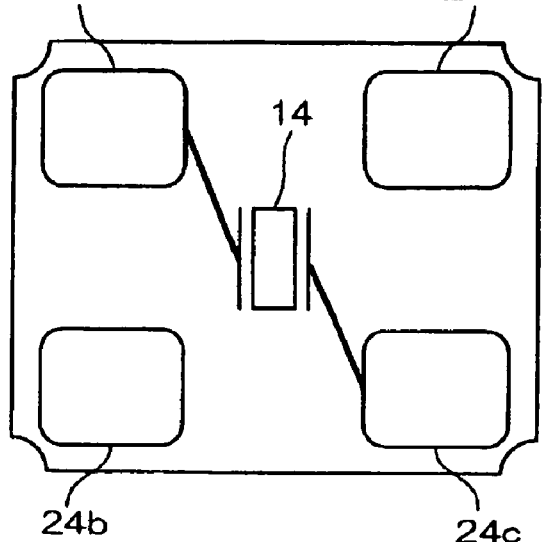
Figure 11:
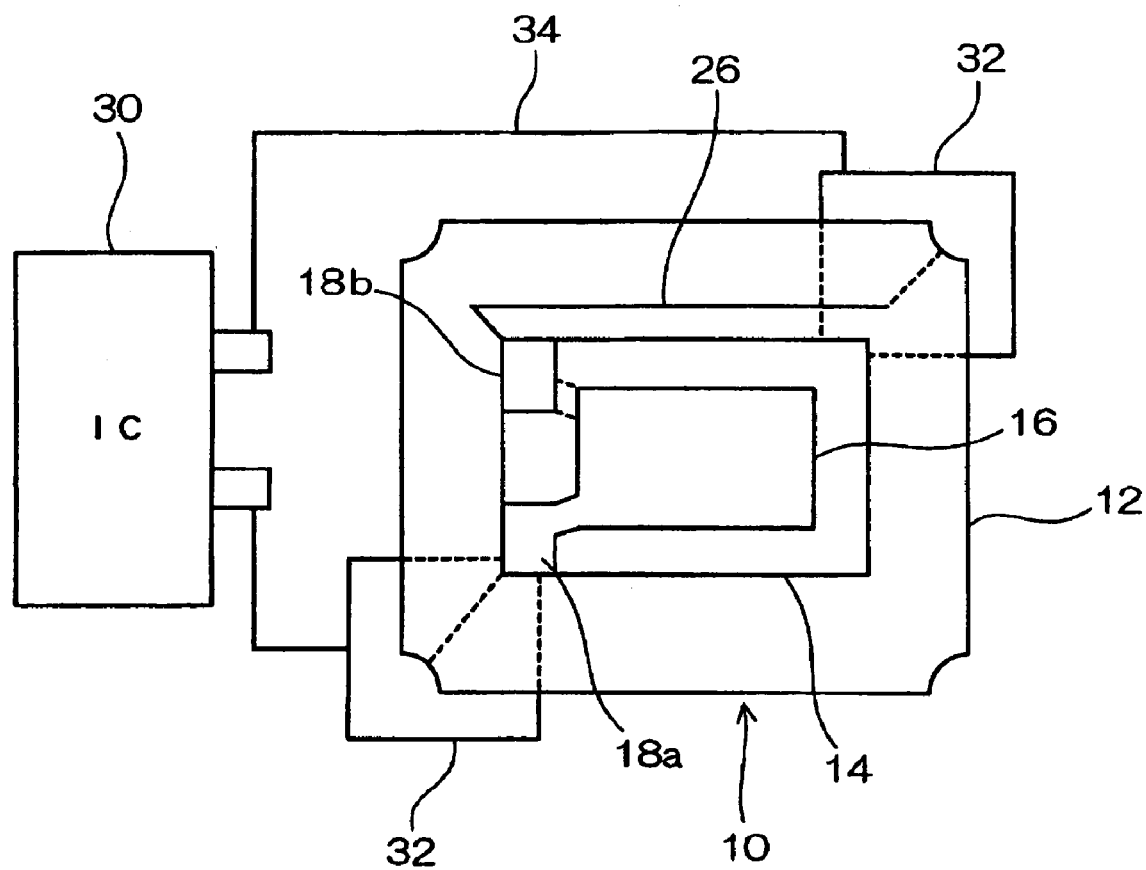
FIG. 11 is a schematic for explaining the mounted state of the prior-art piezoelectric resonator.

FIG. 5 shows, a mounting substrate K1 to mount the related-art piezoelectric resonator 10 as explained with reference to FIG. 10C. In the mounting substrate K1 in the related art, power feeding terminals (X) which are connected with the piezoelectric resonator element 14 are disposed at positions on a diagonal line on the surface of the substrate as shown in FIG. 5. In contrast, FIG. 6 shows a mounting substrate K2 which is prepared to mount the piezoelectric resonator 40 in the exemplary embodiment of the present invention. As shown in the figure, a pair of terminals arrayed on the left side are used as terminals (X) for power feed to the piezoelectric resonator element 44. A situation where the piezoelectric resonator 40 in the exemplary embodiment of the present invention is mounted on such a mounting substrate K2, corresponds to the model view of FIG. 2.

Premising the structural correspondences between the piezoelectric resonators and the mounting substrates as described above, Modification 2 shown in FIG. 4 is sometimes more advantageous over Modification 1 shown in FIG. 3, for the following reasons: When the piezoelectric resonator 40-1 of Modification 1 has been erroneously mounted on the mounting substrate K1 in the related art, one of the power feeding terminals (X) of the mounting substrate K1 and the external electrode 64d-1 of the piezoelectric resonator 40-1 are connected. Although the external electrode 64d-1 is originally the ground terminal (G), it is connected with the metallic cover member 48. Moreover, the metallic cover member 48 and the piezoelectric resonator element 44 lie at close positions in the package 42 in FIG. 1B. Therefore, electrical short-circuiting might occur and lead to a malfunction. Even in a case where the piezoelectric resonator 40-2 of Modification 2 shown in FIG. 4 has been erroneously mounted on the mounting substrate K1 in the related art, the external electrode 64d-2 connected to one power feeding terminal (X) of the mounting substrate K-1 is the dummy terminal and is not apprehended to incur the short-circuiting as stated above.

Figure 7:
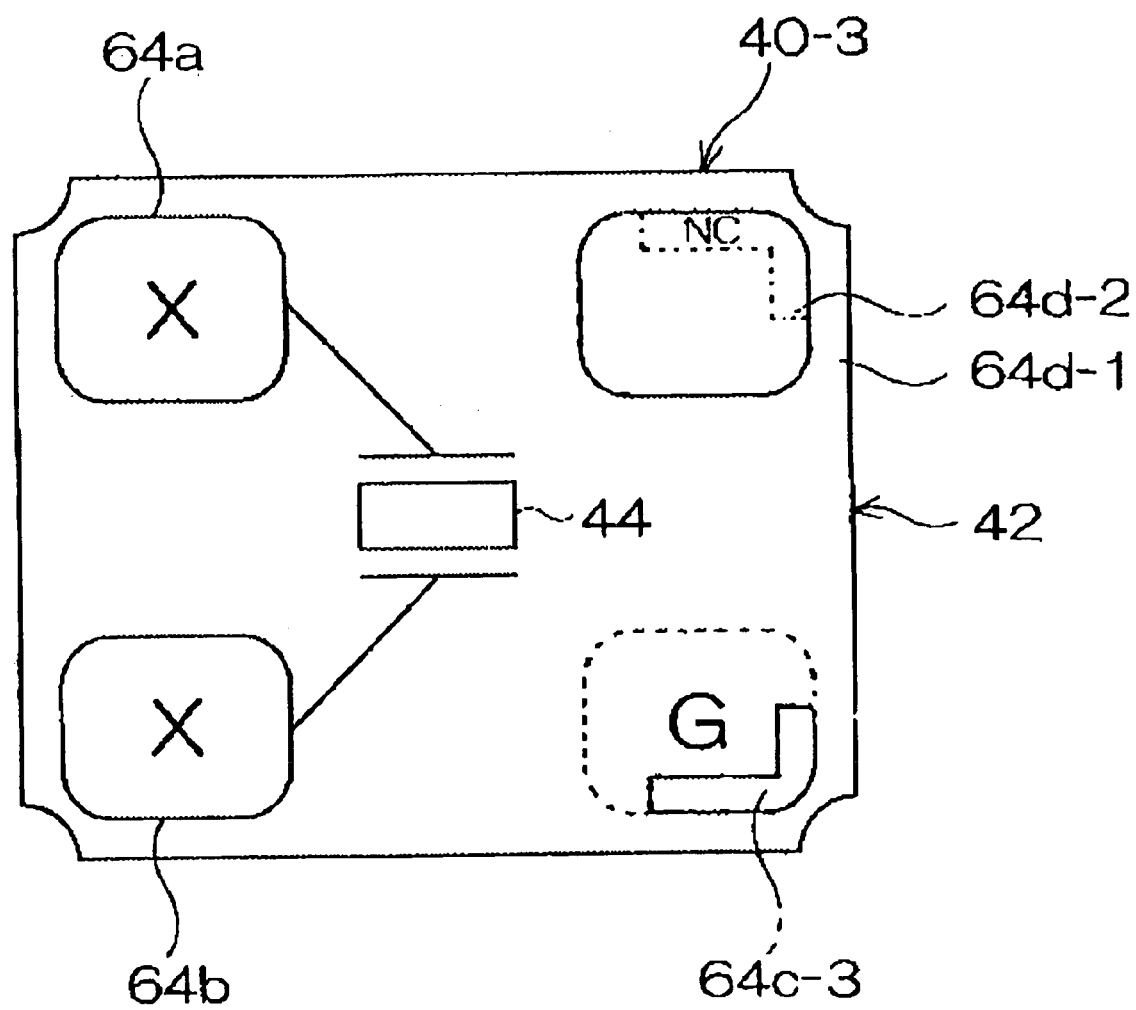
FIG. 7 is a schematic bottom view of Modification 3 of the piezoelectric resonator according to the exemplary embodiment.

FIG. 7 shows Modification 3. In a piezoelectric resonator 40-3 in FIG. 7, one external electrode 64c-3 is formed into a different shape which differs in external appearance from the shape of each of the other external electrodes. Specifically, in this case, the external electrode 64c-3 is formed, for example, so that a fine pattern may be substantially L-shaped or hook-shaped along the outer edge of the package 42. The external electrode 64d-1 may be formed into either the same shape as that of each of the other external electrodes, as indicated by a solid line, or a different shape as that of the external electrode 64c-3, as indicated at numeral 64d-2 by a broken line. In Modification 3, one external electrode 64c-3 is formed into the different shape, so that the piezoelectric resonator 40-3 has a clue to outward distinguishability as to its directivity. Therefore, in a case where the piezoelectric resonator 40-3 is to be mounted on the mounting substrate K2 explained with reference to FIG. 6, the external electrode 64c-3 can be easily recognized outwardly. Hence, erroneous connection of this external electrode 64c-3 to the power feeding terminal side of the mounting substrate K2 as indicated by the marks X can be reduced or prevented.

Figure 8:
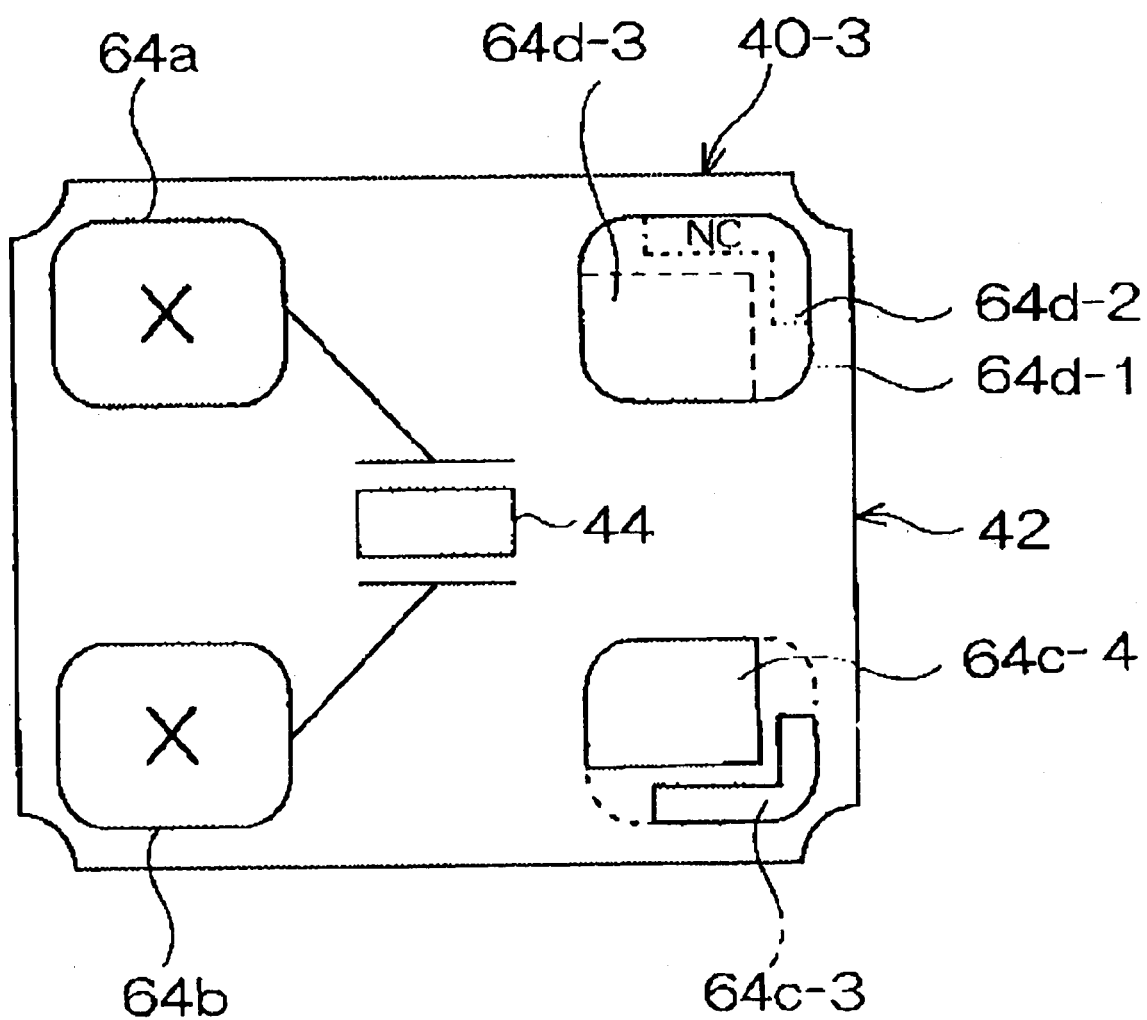
FIG. 8 is a schematic bottom view of Modification 4 of the piezoelectric resonator according to the exemplary embodiment.

FIG. 8 shows Modification 4. In a piezoelectric resonator 40-3 in FIG. 8, one external electrode 64c-3 is formed into a different shape which differs in external appearance from the shape of each of the other external electrodes. At the same time, an external electrode 64c-4, which is a dummy terminal, is also disposed. The external electrode 64d-1 may be formed into either the same shape as that of each of the other external electrodes, as indicated by a solid line, or a different shape as that of the external electrode 64c-3, as indicated at sign 64d-2 by a broken line. Moreover, the external electrode 64d-1 may be formed into the same shape as that of the external terminal 64c-4, as indicated at sign 64d-3 by a broken line. In Modification 4, since the external terminal 64c-4 is disposed, the mounting intensity at the time of mounting the piezoelectric resonator is ensured. Since the external terminal 64c-4 is a dummy terminal, undesirable electrical short-circuiting does not occur.

Figure 9:
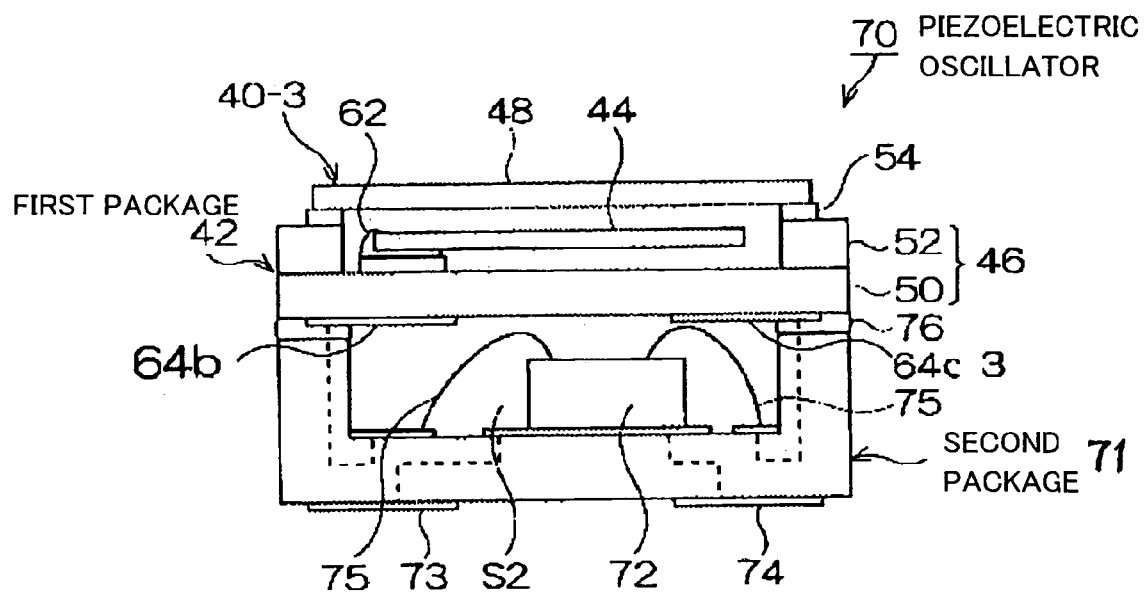
FIG. 9 is a schematic sectional view of a piezoelectric oscillator according to an exemplary embodiment.

FIG. 9 is a schematic view showing a piezoelectric oscillator in an exemplary embodiment of the present invention. Referring to the figure, the piezoelectric oscillator 70 is constructed by utilizing the piezoelectric resonator 40 of the foregoing exemplary embodiment or any of the modifications thereof. Specifically, the piezoelectric oscillator 70 is constructed in such a way that a second package 71 is joined under the first package 42 of the piezoelectric resonator 40-3 by a solder 76.

The second package 71 of the piezoelectric oscillator 70 is formed by, for example, molding an insulating material, such as ceramics, likewise to the first package 42, and it has an inner space S2 inside. An oscillation circuit element 72 is attached to the inner bottom of the second package 71 by die bonding. The oscillation circuit element 72 is formed of, for example, an integrated circuit (IC). This element 72 is connected to mounting terminals 73, 74 disposed on the bottom surface of the second package 71 and is electrically connected with the piezoelectric resonator element 44 through the external electrodes 64a, etc. of the piezoelectric resonator 40-3. The oscillation circuit element 72 is connected with conductive patterns inside the second package 71 through bonding wire pieces 75 by wire bonding. Specifically, such electrical connections are made by forming conductive through-holes in the second package 71 and circumventing the conductive patterns as indicated by broken lines. Alternatively, they are made by the conductive patterns which are formed in such a way that the outer surfaces of castellation parts appearing as quadrants at the four corners of the package 42 in FIG. 1A are coated with a conductive paste.

Here, regarding the external electrodes on the bottom surface of the piezoelectric resonator 40-3, at least one external electrode 64c-3 has a shape extending along the outer edge of the second package 71, as explained with reference to FIG. 7. Thus, the bonding wire is made less liable to touch the external electrode formed on the bottom surface of the piezoelectric resonator 40-3. Therefore, at least one, of the external electrodes is/are formed into the shape extending along the outer edge of the second package 71, whereby the bonding wire can be prevented from touching the external electrode to the utmost.

Although the foregoing exemplary embodiment has been described about the case where the piezoelectric resonator 40 is of the AT-cut resonator element, the piezoelectric resonator element may well be any of an inverted mesa type AT-cut piezoelectric resonator element, a tuning fork type resonator element, etc. Although the foregoing exemplary embodiment has been described in a case where the package 42 has the double-layer structure, the package may well have a layered structure of three or more layers.

What is claimed is:

1. Electric equipment comprising:
   a substrate;
   a piezoelectric resonator including a piezoelectric resonator element, and at least four external electrodes which are disposed at an outer surface of a bottom of a package in which the piezoelectric resonator element is accommodated, one pair of adjacent external electrodes among the external electrodes being electrically connected to electrodes of the piezoelectric resonator element, the one pair of external electrodes being disposed along a shorter latus of the package; and
   an IC having an oscillation circuit for oscillating the piezoelectric resonator,
   wherein one pair of patterns for joining the one pair of adjacent external electrodes is formed on the substrate, the one pair of patterns being disposed near the IC and electrically connected to the IC through a pair of wiring patterns and wherein the pair of wiring patterns extend only along to shorter latus of the package away from the piezoelectric resonator element.

2. The electric equipment of claim 1, wherein at least one of the external electrodes is a ground terminal, and at least one of the external electrodes is a dummy terminal which is not electrically connected.

3. The electric equipment of claim 2, at least one of the other pair of external electrodes formed into a different shape.

4. The electric equipment of claim 3, at least one of the other pair of external electrodes formed at only a position extending along an outer edge of the package.

5. The electric equipment of claim 4, the external electrode which is the dummy terminal being disposed in the vicinity of at least one of the other pair of external electrodes.

6. The electric equipment of claim 1, at least one of the other pair of external electrodes formed into a different shape.

7. The electric equipment of claim 6, at least one of the other pair of external electrodes formed at only a position extending along an outer edge of the package.

8. The electric equipment of claim 7, an external electrode which is a dummy terminal not to be electrically connected being disposed in the vicinity of at least one of the other pair of external electrodes.

9. The electric equipment of claim 1, the one pair of adjacent external electrodes being electrodes having mutually different potentials.

* * * * *